US008860210B2

(12) United States Patent
Kakiuchi et al.

(10) Patent No.: US 8,860,210 B2
(45) Date of Patent: Oct. 14, 2014

(54) SEMICONDUCTOR DEVICE

(75) Inventors: Eisaku Kakiuchi, Toyota (JP); Yasuji Taketsuna, Okazaki (JP); Masahiro Morino, Okazaki (JP); Yuya Takano, Nishio (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/258,860

(22) PCT Filed: Jun. 10, 2009

(86) PCT No.: PCT/JP2009/060577
§ 371 (c)(1),
(2), (4) Date: Sep. 22, 2011

(87) PCT Pub. No.: WO2010/143273
PCT Pub. Date: Dec. 16, 2010

(65) Prior Publication Data
US 2012/0012996 A1    Jan. 19, 2012

(51) Int. Cl.
| | |
|---|---|
| H01L 23/34 | (2006.01) |
| H01L 23/473 | (2006.01) |
| H01L 23/13 | (2006.01) |
| H01L 23/367 | (2006.01) |
| H01L 25/07 | (2006.01) |
| H01L 23/373 | (2006.01) |
| H01L 23/433 | (2006.01) |

(52) U.S. Cl.
CPC ............. *H01L 23/473* (2013.01); *H01L 23/13* (2013.01); *H01L 23/3677* (2013.01); *H01L 25/072* (2013.01); *H01L 23/3735* (2013.01); *H01L 23/433* (2013.01)
USPC ........................... 257/712; 257/720; 165/185

(58) Field of Classification Search
CPC ..... H01L 23/36; H01L 31/024; H01L 31/052; H01L 33/64; H01L 21/4871; H01L 21/4882; H01L 2023/405; H01L 2023/4043; H01L 2023/4056; H01L 2933/0075
USPC .................... 257/712, 720; 438/122; 165/185
See application file for complete search history.

(56) References Cited

U.S. PATENT DOCUMENTS 4,685,987 A * 8/1987 Fick ............................... 156/247
5,485,037 A * 1/1996 Marrs ........................... 257/712

(Continued)

FOREIGN PATENT DOCUMENTS

EP    1873827 A1 *  1/2008
JP    06-244331 A    9/1994

(Continued)

OTHER PUBLICATIONS

International Search Report of PCT/JP2009/060577 mailed Sep. 1, 2009.

*Primary Examiner* — David Zarneke
(74) *Attorney, Agent, or Firm* — Kenyon & Kenyon LLP

(57) ABSTRACT

Disclosed is a semiconductor device that can properly relax a stress produced by a difference in coefficient of linear expansion between an insulating substrate and a cooler and can properly remove heat by cooling of a semiconductor element. A semiconductor device comprises an insulating substrate, a semiconductor element provided on the insulating substrate, a cooler, and a porous metal plate provided between the insulating substrate and the cooler. Through holes in the porous metal plate are open at least to that surface of the porous metal plate which faces the cooler. The sectional size of the pores decreases gradually from the cooler side toward the insulating substrate side.

2 Claims, 19 Drawing Sheets

(56) References Cited

U.S. PATENT DOCUMENTS

| | | | |
|---|---|---|---|
| 5,520,244 A * | 5/1996 | Mundinger et al. | 165/104.33 |
| 5,973,407 A * | 10/1999 | Tzu et al. | 257/796 |
| 6,043,985 A * | 3/2000 | Azdasht et al. | 361/707 |
| 6,591,897 B1 * | 7/2003 | Bhatti et al. | 165/80.3 |
| 6,729,383 B1 * | 5/2004 | Cannell et al. | 165/80.3 |
| 6,834,711 B2 * | 12/2004 | Liu et al. | 165/80.3 |
| 6,934,154 B2 * | 8/2005 | Prasher et al. | 361/699 |
| 7,044,212 B1 | 5/2006 | Hofmann | |
| 7,085,135 B2 * | 8/2006 | Chu et al. | 361/704 |
| 7,957,146 B2 * | 6/2011 | Kraus et al. | 361/709 |
| 8,455,998 B2 * | 6/2013 | Iruvanti et al. | 257/713 |
| 2003/0205369 A1 | 11/2003 | Liu et al. | |
| 2005/0281000 A1 * | 12/2005 | Chu et al. | 361/704 |
| 2007/0004090 A1 * | 1/2007 | Brandenburg et al. | 438/122 |
| 2007/0047209 A1 * | 3/2007 | Thompson et al. | 361/710 |
| 2007/0120250 A1 * | 5/2007 | Fairchild et al. | 257/712 |
| 2008/0030957 A1 * | 2/2008 | Abul-Haj et al. | 361/703 |
| 2008/0128896 A1 * | 6/2008 | Toh et al. | 257/712 |
| 2010/0091463 A1 * | 4/2010 | Buresch et al. | 361/718 |
| 2010/0186938 A1 * | 7/2010 | Murata et al. | 165/185 |
| 2013/0277034 A1 * | 10/2013 | Iwata et al. | 165/185 |

FOREIGN PATENT DOCUMENTS

| | | |
|---|---|---|
| JP | 08-335652 A | 12/1996 |
| JP | 09-162336 A | 6/1997 |
| JP | 2002-237556 A | 8/2002 |
| JP | 2003-110069 A | 4/2003 |
| JP | 2004-518269 A | 6/2004 |
| JP | 2004-289063 A | 10/2004 |
| JP | 2006-294699 A | 10/2006 |

* cited by examiner

SEMICONDUCTOR DEVICE

CROSS-REFERENCE TO RELATED APPLICATIONS

This is a 371 national phase application of PCT/JP2009/060577 filed on 10 Jun. 2009, the entire contents of which are incorporated herein by reference.

TECHNICAL FIELD

The present invention relates to a semiconductor device and, in particular, to a semiconductor device including a cooler for cooling heat generated by a semiconductor element.

BACKGROUND ART

Inverters having a power converting function are used as power sources of hybrid electric vehicles and others. Each of such inverters includes a plurality of semiconductor elements as a switching element. The semiconductor elements of the invertors generate heat in association with power conversion and the like and thus need to be cooled actively. For this purpose, there is proposed a semiconductor device including a cooling function to cool heat generated by a semiconductor element (see Patent Document 1 for example).

RELATED ART DOCUMENTS

Patent Documents

Patent Document 1: JP2002-237556A

Patent Document 1 discloses a semiconductor device including an insulating substrate, a semiconductor element placed on this insulating substrate, cooling means, and a porous metal plate placed between the insulating substrate and the cooling means. The porous metal plate is formed with a plurality of through holes each having a columnar shape extending through the metal plate from a surface of the metal plate facing to the insulating substrate and a surface of the same facing to the cooling means. The metal plate has lower rigidity due to the through holes and thus is likely to warp or become deform. Patent Document 1 discloses that this metal plate is therefore placed between the insulating substrate and the cooling means to absorb a difference in thermal extension between the insulating substrate having a small linear expansion coefficient and the cooling means (a heat radiating plate) having a large linear expansion coefficient, thereby relaxing a stress.

DISCLOSURE OF THE INVENTION

Problems to be Solved by the Invention

However, when many columnar-shaped through holes extending through the porous metal plate are provided to relax the stress generated due to the difference in linear expansion coefficient between the insulating substrate and the cooling means, thermal capacity and thermal conductivity of the porous metal plate decrease. Accordingly, there is a possibility that the porous metal plate could not appropriately transfer the heat having been transferred from the semiconductor element to the insulating substrate, to the cooling means (a cooler). In particular, in the case where a large amount of heat is generated instantly by the semiconductor element, the heat transferred from the semiconductor element to the insulating substrate may not be absorbed completely by the porous metal plate. Thus, the semiconductor device of Patent Document 1 mentioned above may not appropriately cool the heat of the semiconductor element.

The present invention has been made in view of the circumstances and has a purpose to provide a semiconductor device capable of appropriately relaxing stress caused due to a difference in linear expansion coefficient between an insulating substrate and a cooler and capable of appropriately cooling heat of a semiconductor element.

Means of Solving the Problems (1) One aspect of the invention provides a semiconductor device comprising an insulating substrate, a semiconductor element placed on the insulating substrate, a cooler, and a porous metal plate formed with a plurality of holes and placed between the insulating substrate and the cooler, wherein the holes of the porous metal plate are holes open at least at a face of the porous metal plate facing to the cooler, and each of the holes has a sectional shape gradually decreasing from the cooler side toward the insulating substrate side.

In the aforementioned semiconductor device, the porous metal plate is placed between the insulating substrate and the cooler (with a larger linear expansion coefficient than the linear expansion coefficient of the insulating substrate). In addition, each hole or pore of the porous metal plate opens at least at the surface of the metal plate facing to the cooler. In such a metal plate, the rigidity of at least a portion of the metal plate on the cooler side is low. Thus, the portion of the metal plate on the cooler side is easy to warp or become deformed. As above, the porous metal plate is designed such that the portion close to the cooler (a member tending to thermally expand more than the insulating substrate) has low rigidity. Accordingly, the porous metal plate can absorb a difference in thermal extension between the insulating substrate and the cooler, thereby appropriately relaxing or reducing stress caused due to the difference in linear expansion coefficient between the insulating substrate and the cooler.

Furthermore, each hole of the porous metal plate has a shape whose sectional shape (the section viewed when the porous metal plate is cut along a direction perpendicular to its thickness direction) decreases gradually from the cooler side toward the insulating substrate side. Even if each hole has a smaller section at the portion of the porous metal plate on the insulating substrate (with a small linear expansion coefficient, i.e., with small thermal extension) side, the stress caused due to the difference in linear expansion coefficient between the insulating substrate and the cooler can be relaxed appropriately as long as each hole has a larger section at the portion close to the cooler (with a large linear expansion coefficient, i.e., with large thermal extension) side.

In addition, since the section of each hole is small at the portion (on the insulating substrate side) near the semiconductor element which is a heat source, the thermal capacity and the thermal conductivity of the porous metal plate can be enhanced. Further, the porous metal plate can provide the high thermal capacity in the portion on the insulating substrate side, so that even when a large amount of heat is instantly generated by the semiconductor element, the porous metal plate can appropriately absorb the heat transferred from the semiconductor element to the insulating substrate. In the aforementioned semiconductor device with the above configuration, the heat of the semiconductor element can be cooled well.

It is to be noted that "hole open at least at the face of the porous metal plate facing to the cooler" may include for example a "through hole extending through the porous metal plate from the face (a front surface) of the porous metal plate facing to the insulating substrate to the face (a back surface) facing to the cooler (i.e., a through hole open at the front surface and the back surface of the porous metal plate)" and a "bottomed hole open at only the face (the back surface) of the porous metal plate facing to the cooler".

(2) Furthermore, in the semiconductor device in (1), preferably, the holes have either a conical shape or a truncated conical shape.

In the aforementioned semiconductor device, each hole of the porous metal plate is conical or truncated conical in shape. More concretely, the conical or truncated conical shape is selected as the shape of each hole whose sectional shape gradually decreases from the cooler side toward the insulating substrate side. The conical or truncated conical holes are easy to make. For instance, a metal plate may be subjected to a cutting work using a drill having a conical or truncated conical blade, thereby producing a porous metal plate having conical or truncated conical holes. The above semiconductor device is therefore low in cost.

(3) Furthermore, in the semiconductor device in (1) or (2), preferably, each of the holes of the porous metal plate is a through hole extending through the porous metal plate from a face of the porous metal plate facing to the insulating substrate to the face facing to the cooler.

In the above semiconductor device, the holes of the porous metal plate are through holes each extending through the porous metal plate from the face (the front surface) of the porous metal plate facing to the insulating substrate to the face (the back surface) facing to the cooler. Such porous metal plate having the above through holes is low in rigidity and hence easy to warp or become deformed. This can appropriately relax the stress caused due to the difference in linear expansion coefficient between the insulating substrate and the cooler.

(4) Furthermore, the semiconductor device in (3) preferably includes a thermal conductor placed in each of the through holes with a clearance from a side surface of the through hole of the porous metal plate, and each thermal conductor is shaped to extend from the face of the porous metal plate facing to the insulating substrate to the face of the porous metal plate facing to the cooler.

In the above semiconductor device, the thermal conductors are set respectively in the holes (the through holes) of the porous metal plate. Each thermal conductor is shaped to extend from the face (the front surface) of the porous metal plate facing to the insulating substrate to the face (the back surface) facing to the cooler. Accordingly, the thermal conductors are also located between the insulating substrate and the cooler. Through these thermal conductors as well as the porous metal plate, the heat transferred from the semiconductor element to the insulating substrate can be transferred to the cooler. Therefore, the thermal conductivity from the semiconductor element to the cooler can be improved and thus the cooling capability of the semiconductor element can be increased.

Further, the thermal conductors are placed in the holes (the through holes) with a clearance from the side surface of each hole (each through hole) of the porous metal plate. When the porous metal plate warps or becomes deformed, therefore, deforming of the porous metal plate is not interrupted by the thermal conductors. Accordingly, the porous metal plate can appropriately relax the stress caused due to the difference in linear expansion coefficient between the insulating substrate and the cooler.

(5) Furthermore, in the semiconductor device in (1) or (2), preferably, the holes of the porous metal plate are bottomed holes open at only the face facing to the cooler.

In the above semiconductor device, each hole of the porous metal plate is a bottomed hole open at only the face (the back surface) facing to the cooler. Accordingly, openings of the holes are absent at the face (the front surface) of the porous metal plate facing to the insulating substrate. The thermal capacity and the thermal conductivity of the porous metal plate can therefore be increased in the portion of the porous metal plate close to the semiconductor element which is a heat source (i.e., near the insulating substrate). Thus, the cooling capability of the semiconductor element can be increased.

Even the porous metal plate in which the holes are not open at the face (the front surface) facing to the insulating substrate having a small linear expansion coefficient (i.e., small thermal extension) also can appropriately relax the stress caused due to the difference in linear expansion coefficient between the insulating substrate and the cooler as long as the holes are open at the face (the back surface) facing to the cooler having a large linear expansion coefficient (i.e., large thermal extension).

(6) Furthermore, the semiconductor device in (5) preferably comprises: a thermal conductor placed in each of the bottomed holes with a clearance from the side surface of each bottomed hole of the porous metal plate, and each thermal conductor is shaped to extend from a bottom surface of the bottomed hole of the porous metal plate to the face facing to the cooler.

In the above semiconductor device, the thermal conductors are set respectively in the holes (the bottomed holes) of the porous metal plate. Each thermal conductor is shaped to extend from the bottom surface of each hole (each bottomed hole) of the porous metal plate to the face (the back surface) facing to the cooler. Accordingly, the thermal conductors are also located between the insulating substrate and the cooler. Through these thermal conductors as well as the porous metal plate, the heat transferred from the semiconductor element to the insulating substrate can be transferred to the cooler. Thus, the cooling capability of the semiconductor element can be increased.

Further, the thermal conductors are set respectively in the holes (the bottomed holes) of the porous metal plate with a clearance from the side surface of each hole (each bottomed hole). When the porous metal plate warps or becomes deformed, therefore, deforming of the porous metal plate is not interrupted by the thermal conductors. Accordingly, the porous metal plate can appropriately relax the stress caused due to the difference in linear expansion coefficient between the insulating substrate and the cooler.

(7) Furthermore, in the semiconductor device in (1), preferably, the porous metal plate includes: a main body; and a thermal conductive portion having a side surface surrounded by the hole and extending from the face of the porous metal plate facing to the cooler toward the insulating substrate, the thermal conductive portion being integrally connected to the main body.

In the above semiconductor device, the porous metal plate includes the main body and the thermal conductive portions with side surfaces surrounded by the holes (the through holes or the bottomed holes), each thermal conductive portion extending from the face (the back surface) of the porous metal plate facing to the cooler to the insulating substrate side. The thus configured porous metal plate can provide the same operations and effects as the "porous metal plate+thermal conductors" in the semiconductor device in (4) or (6). Because the "main body" of the above porous metal plate corresponds to the "porous metal plate" in (4) or (6), the "thermal conductive portions" of the above porous metal plate correspond to the "thermal conductors" in (4) or (6), and the "holes" of the above porous metal plate correspond to the "clearances (clearances between the side surfaces of the holes of the porous metal plate and the thermal conductors)" in (4) or (6).

To be concrete, in the above semiconductor device, in addition to the main body (corresponding to the porous metal plate in (4) or (6)), the heat transferred from the semiconductor element to the insulating substrate can also be transferred to the cooler through the thermal conductive portions (corresponding to the thermal conductors in (4) or (6)). Accordingly, the thermal conductivity from the semiconductor element to the cooler can be improved and thus the cooling capability of the semiconductor element can be increased.

Further, the holes (corresponding to the clearances S in (4) or (6)) are interposed between the thermal conductive portions (corresponding to the thermal conductors in (4) or (6)) and the main body (corresponding to the porous metal plate in (4) or (6)). When the porous metal plate (the main body) warps or becomes deformed, therefore, deforming of the porous metal plate (the main body) is not interrupted by the thermal conductors. Accordingly, also in the above semiconductor device, similar to the semiconductor device in (4) or (6), the porous metal plate can appropriately relax the stress caused due to the difference in linear expansion coefficient between the insulating substrate and the cooler.

Herein, the semiconductor device described in (4) corresponds to a semiconductor device including thermal conductors set respectively in the holes (the through holes) with the clearances from the side surfaces of the holes (the through holes) of the porous metal plate, as mentioned above, in which each of the thermal conductors is shaped to extend from the face of the porous metal plate facing to the insulating substrate to the face facing to the cooler. Further, the semiconductor device described in (6) corresponds to a semiconductor device including thermal conductors set respectively in the holes (the bottomed holes) with the clearances from the side surfaces of the holes (the bottomed holes) of the porous metal plate, as mentioned above, in which each of the thermal conductors is shaped to extend from the bottom surfaces of the holes (the bottomed holes) of the porous metal plate to the face facing to the cooler.

In the semiconductor device described in (4) or (6), the porous metal plate and the thermal conductors are separate components. In contrast, in the above semiconductor device, the thermal conductive portions are integrally connected to the main body of the porous metal plate. Specifically, the thermal conductive portions (corresponding to the thermal conductors in (4) or (6)) and the main body (corresponding to the porous metal plate in (4) or (6)) are configured in one piece. Therefore, the number of components is reduced and the productivity of the semiconductor device is improved. The above semiconductor device is thus low in cost.

(8) Furthermore, in the semiconductor device in (7), preferably, the holes of the porous metal plate are through hole each having a sectional shape corresponding to a partly-broken ring, the through holes extending through the porous metal plate from the face of the porous metal plate facing to the insulating substrate toward the face facing the cooler, the through holes being placed respectively around the side surfaces of the thermal conductive portions, and the main body of the porous metal plate and the thermal conductive portions are integrally connected at a position where the ring shape of the through hole is broken.

In the above semiconductor device, the holes of the porous metal plate are provided as the through holes having a sectional shape corresponding to a ring that is partly broken (a sectional shape corresponding to a ring that is not partly continuous when the porous metal plate is cut along a direction perpendicular to its thickness direction) and extending through the porous metal plate from the face (the front surface) of the porous metal plate facing to the insulating substrate and the face (the back surface) facing to the cooler. These through holes are arranged around the side surface of each thermal conductive portion. The main body of the porous metal plate and the thermal conductive portions are integrally continuous at positions where the ring shape of each through hole is broken. The thus configured porous metal plate can provide the same operations and effects as the "porous metal plate+thermal conductors" of the semiconductor device disclosed in (4) as mentioned above.

The "main body" of the above porous metal plate corresponds to the "porous metal plate" in (4), the thermal conductive portions" of the above porous metal plate correspond to the "thermal conductors" in (4), and the "through holes" of the above porous metal plate correspond to the "clearances (clearances between the side surfaces of the holes of the porous metal plate and the thermal conductors)" in (4).

The "sectional shape corresponding to a ring that is partly broken" may include for example a sectional shape consisting of a circular shape divided into halves, a C-like sectional shape formed of a circular shape a part of which is removed, and others. The ring may be not only a circular ring but also any other shaped rings (a rectangular ring and so on).

(9) Furthermore, in the semiconductor device in (7), preferably, the holes of the porous metal plate are bottomed holes each having a sectional shape corresponding to one of a ring shape and a partly-broken ring shape, the bottomed holes extending from the face of the porous metal plate facing to the cooler toward the insulating substrate, the bottomed holes being open at only the face of the porous metal plate facing to the cooler, and the bottomed holes being placed respectively around the side surfaces of the thermal conductive portions, and the main body of the porous metal plate and the thermal conductive portions are integrally connected at least on the insulating substrate side of the thermal conductive portions.

In the above semiconductor device, the holes of the porous metal plate are provided as the bottomed holes each having a sectional shape corresponding to a ring or a partly-broken ring (a sectional shape corresponding to a ring or a partly-broken ring viewed when the porous metal plate is cut along a direction perpendicular to its thickness direction), extending from the face (the back surface) of the porous metal plate facing to the cooler to the insulating substrate side, and opening only at the face (the back surface) of the porous metal plate facing to the cooler. The bottomed holes are arranged respectively around the side surfaces of the thermal conductive portions. The main body of the porous metal plate and the thermal conductive portions are integrally continuous at least on the insulating substrate side of the thermal conductive portions. The thus configured porous metal plate can provide the same operations and effects as the "porous metal plate+ thermal conductors" in the semiconductor device described in (6) as mentioned above.

The "main body" of the above porous metal plate corresponds to the "porous metal plate" in (6), the "thermal conductive portions" of the above porous metal plate correspond to the "thermal conductors" in (6), and the "bottomed holes" of the porous metal plate correspond to the "clearances (clearances between the side surfaces of the holes of the porous metal plate and the thermal conductors)" in (6).

MODE FOR CARRYING OUT THE INVENTION

Example 1

A detailed description of Example 1 of the present invention will now be given referring to the accompanying drawings.

Figure 1:
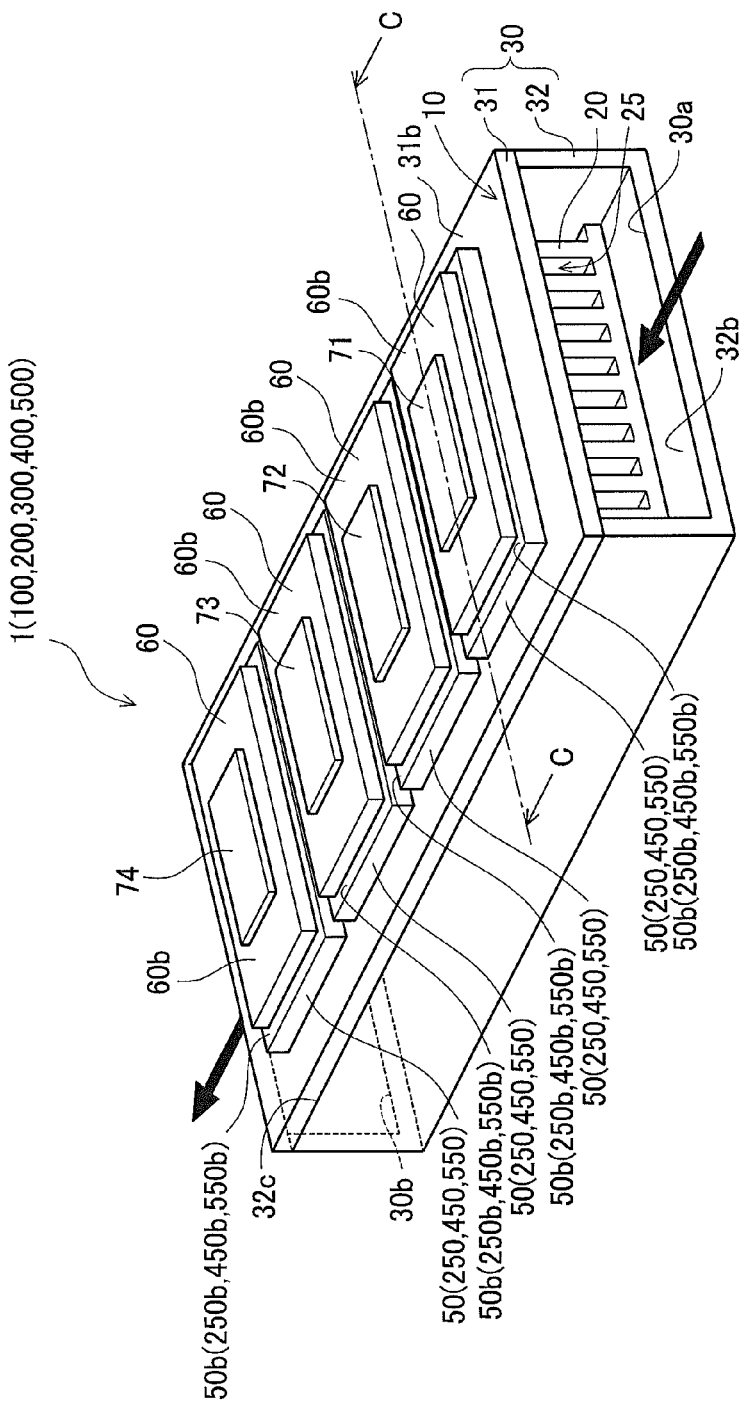
FIG. 1 is a perspective view of a semiconductor device of Example 1.

A semiconductor device 1 of Example 1 includes, as shown in FIG. 1, semiconductor elements 71 to 74, insulating substrates 60, porous metal plates 50, and a cooler 10. Specifically, the semiconductor elements 71 to 74 are respectively placed (soldered) on the insulating substrates 60. The porous metal plates 50 are placed respectively between the insulating substrates 60 and the cooler 10. Arrows in FIG. 1 indicate the flowing direction of coolant (e.g., water) flowing in the cooler 10.

The cooler 10 includes a frame 30 and a fin member 20 contained in the frame 30. The frame 30 and the fin member 20 are bonded by brazing.

Figure 3:
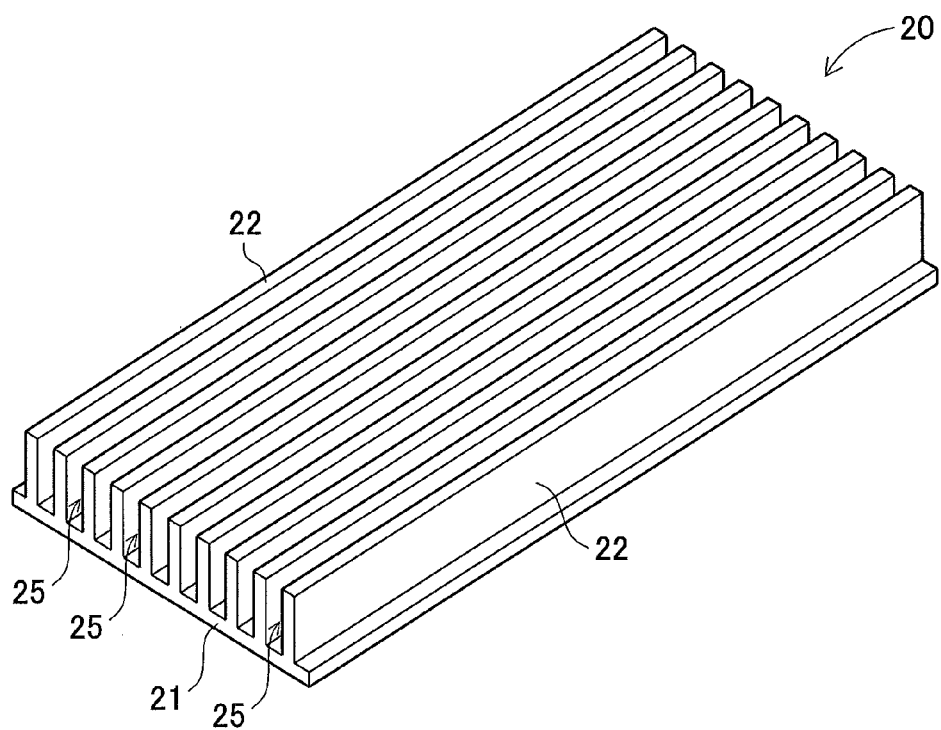
FIG. 3 is a perspective view of a fin member of a cooler of Example 1.

The fin member 20 is made of aluminum and includes a rectangular flat-plate-shaped base 21 and a plurality of fins (ten fins in Example 1) 22 each protruding from one surface of the base 21 as shown in FIG. 3. The fins 22 each have a rectangular flat plate shape. The plurality of fins (ten fins in Example 1) are arranged in line at regular intervals in a short-side direction of the base 21 (in a direction perpendicular to the coolant flowing direction). Flow channels 25 for coolant are formed between the fins 22. For example, this fin member 20 is integrally made of aluminum by extrusion molding.

Figure 2:
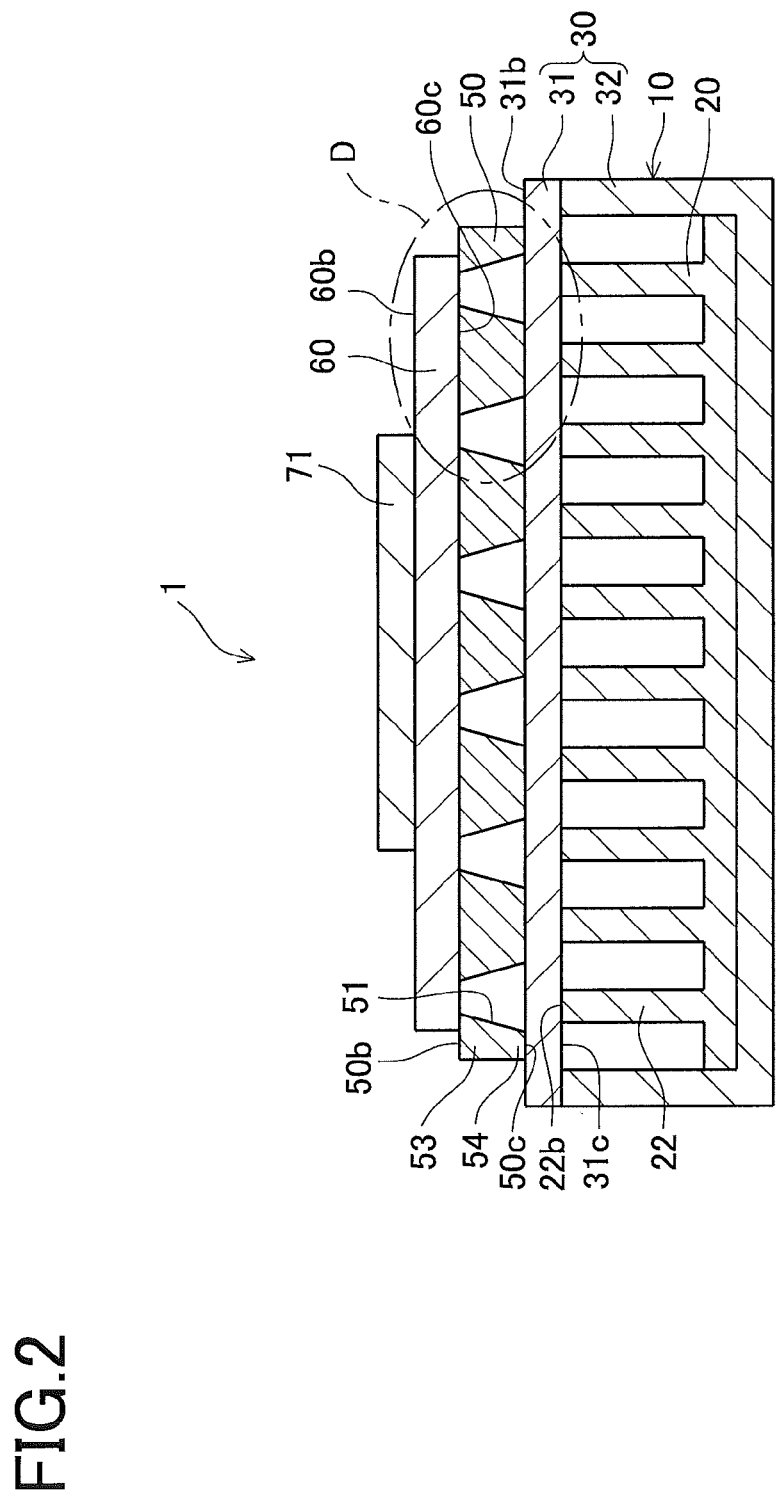
FIG. 2 is a sectional view of the semiconductor device of Example 1, taken along a line C-C in FIG. 1.

The frame 30 includes a first frame part 31 made of aluminum in a rectangular flat plate shape and a second frame part 32 made of aluminum with an angular U-shaped section (see FIGS. 1 and 2). The first frame part 31 and the second frame part 32 are bonded by brazing. Thus, the frame 30 has a rectangular tubular shape. In this frame 30, one end in its longitudinal direction (in a direction coinciding the coolant flowing direction) forms an inlet 30a for allowing inflow of coolant and the other end in the longitudinal direction forms an outlet 30b for allowing discharge of coolant (see FIG. 1).

On an outer surface 31b of the first frame part 31 forming the cooler 10, four porous metal plates 50 are arranged at regular intervals (see FIGS. 1 and 2). The four porous metal plates 50 are brazed to the outer surface 31b of the first frame part 31.

Figure 4:
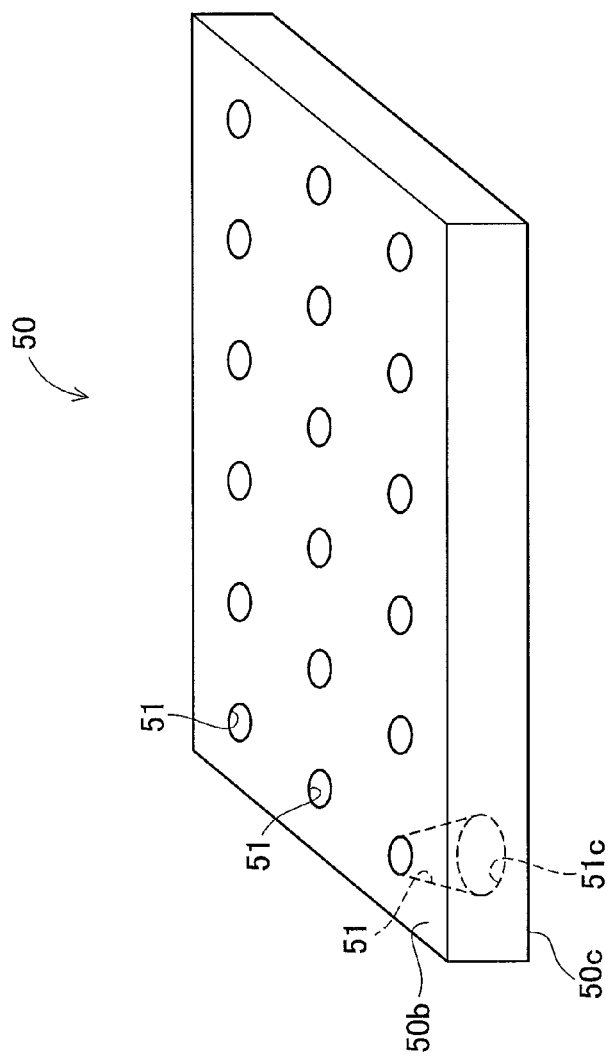
FIG. 4 is a perspective view of a porous metal plate of Example 1.

Each porous metal plate 50 is made of aluminum in a rectangular flat plate shape as shown in FIG. 4. Each porous metal plate 50 is formed with a plurality of through holes 51 each extending through a porous metal plate 50 in its thickness direction. The through holes 51 extend from a front surface 50b (a face facing to an insulating substrate 60 side) of the porous metal plate to a back surface 50c of the porous metal plate (a face facing to the cooler 10) as shown in FIG. 2. Accordingly, the through holes 51 open at the front surface 50b and the back surface 50b of a porous metal plate 50.

In addition, each through hole 51 has a sectional shape (a sectional shape viewed when the porous metal plate 50 is cut along a direction perpendicular to the thickness direction) gradually decreasing from the cooler 10 side to the insulating substrate 60 side (from the back surface 50c toward the front surface 50b; from below to above in FIG. 2). To be more concrete, each through hole 51 has a truncated conical shape with a diameter gradually decreasing (a hole diameter narrowing) from the back surface 50c toward the front surface 50b (see FIG. 4).

On the front surfaces 50b of the porous metal plates 50, the insulating substrates 60 are respectively placed (see FIGS. 1 and 2). The insulating substrates 60 are respectively brazed to the front surfaces 50b of the porous metal plates 50. Each insulating substrate 60 is formed of an electrically-insulating member (e.g., ceramic such as alumina) in a rectangular flat plate shape.

Furthermore, on the front surfaces 60b of the four insulating substrates 60, the semiconductor elements 71 to 74 are respectively placed (see FIGS. 1 and 2). The semiconductor elements 71 to 74 are soldered to the front surfaces 60b of the insulating substrates 60. The semiconductor elements 71 to 74 are semiconductor elements such as IGBT.

Herein, a cooling operation by the semiconductor device 1 of Example 1 will be explained below. The semiconductor elements 71 to 74 generate heat during use. The heat from each semiconductor element is transferred to the porous metal plates 50 through the insulating substrates 60. Further, the heat is transferred to the frame 30 (the first frame part 31) and then to the fins 22 of the fin member 20 accommodated in the frame 30.

As indicated by an arrow in FIG. 1, coolant (e.g., water) is introduced to continuously flow into the frame 30 through the inlet 30a. The coolant introduced into the frame 30 flows through the flow channels 25 defined between the fins 22 toward the outlet 30b. Thus, the fins 22 of the fin member 20 can exchange heat with the coolant flowing in the flow channels 25. In other words, the heat transferred from the semiconductor elements 71 to 74 can be released to the coolant flowing in the flow channels 25. The coolant absorbing the heat of the fins 22 while flowing in the flow channels 25 is discharged out of the frame 30 through the outlet 30b. In this way, the heated semiconductor elements 71 to 74 are cooled.

Meanwhile, the insulating substrates 60 and the frame 30 (the first frame part 31) are greatly different in linear expansion coefficient. Specifically, in the case where the insulating substrates 60 made of alumina are used, for example, its linear expansion coefficient is about $7 \times 10^{-6}/°C$. On the other hand, the frame 30 (the first frame part 31) made of aluminum has a linear expansion coefficient of about $23 \times 10^{-6}/°C$. In this case, the linear expansion coefficient of the frame 30 (the first frame part 31) is three times or more than the linear expansion coefficient of the insulating substrates 60. Accordingly, when the heat generated by the semiconductor elements 71 to 74 is transferred to respective insulating substrates 60 and the first frame part 31, the frame 30 (the first frame part 31) will thermally extend (thermally expand) more than the insulating substrates 60.

Figure 5:
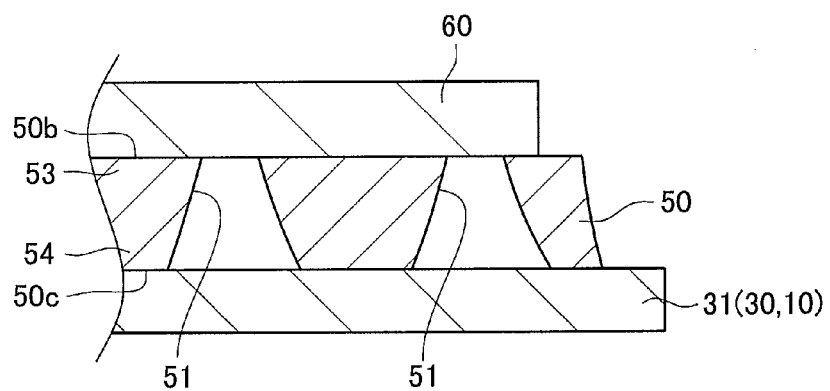
FIG. 5 is an explanatory view showing operations and effects of the porous metal plate of Example 1, corresponding to an enlarged view of part D in FIG. 2.

On the other hand, in the semiconductor device 1 of Example 1, as mentioned above, the porous metal plates 50 are placed respectively between the insulating substrates 60 and the cooler 10 (the first frame part 31). In addition, each plate 50 is formed with the through holes 51 open at the back surface 50c (the face of the plate 50 facing to the cooler 10) and the front surface 50b of the plate 50 (see FIG. 2). In those plates 50, at least a portion 54 of each plate 50 on close to the cooler 10 is low in rigidity and the portion 54 is easy to warp or become deformed (see FIG. 5). Since the portion 54 of each plate 50 on the cooler 10 side is of low rigidity as above, each plate 50 can absorb the difference in thermal extension between the insulating substrate 60 and the cooler 10 (the first frame part 31) and thereby appropriately relax the stress caused due to the difference in linear expansion coefficient between the insulating substrate 60 and the cooler 10 (the first frame part 31) (see FIG. 5). FIG. 5 shows a state where the plate 50 warps or becomes deformed, thereby absorbing the difference in thermal extension between the insulating substrate 60 and the cooler 10 (the first frame part 31).

In addition, the through holes 51 of each porous metal plate 50 each have a sectional shape (a sectional shape viewed when the plate 50 is cut along a direction perpendicular to the thickness direction) gradually decreasing from the cooler 10 side to the insulating substrate 60 side (from the back surface 50c toward the front surface 50b; from below to above in FIG. 2). To be concrete, each through hole 51 has a truncated conical shape with a diameter gradually decreasing (a hole diameter narrowing) from the back surface 50c toward the front surface 50b. Even when the section of each through hole 51 located in a portion 53 of the plate 50 close to the insulating substrate 60 (with a small thermal extension) is small (i.e., the hole diameter of each through hole 51 is small), as long as the section of each through hole 51 located in the portion 54 of the plate 50 close to the cooler 10 (with a large thermal extension) is large, the stress caused due to the difference in linear expansion coefficient between the insulating substrate 60 and the cooler 10 can be appropriately relaxed.

Figure 6:
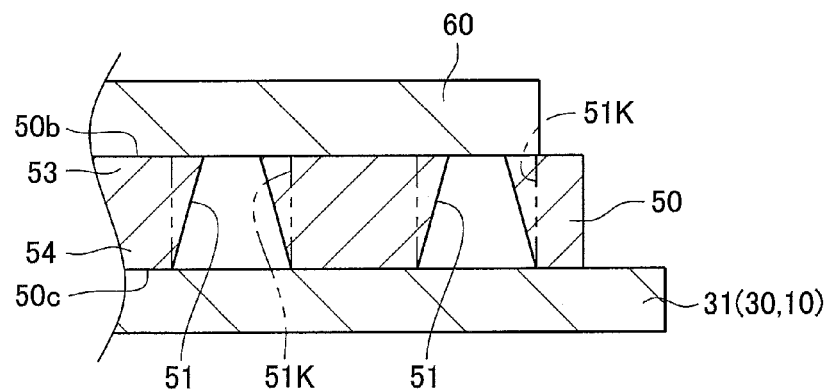
FIG. 6 is an explanatory view showing operations and effects of the porous metal plate of Example 1, corresponding to an enlarged view of part D in FIG. 2.

In addition, since the section of each through hole 51 is small (i.e., the hole diameter of each through hole 51 is small) in the portion (on the insulating substrate 60 side) close to the semiconductor element 71 to 74 which is a heat source, it is possible to more increase the volume (weight) of the porous metal plate as compared with the case where through holes 51K (indicated by a chain double-dashed line in FIG. 6) each having a section size (a hole diameter) equal to that of each opening 51c in the back surface 50c and a columnar-shape extending to the front surface 50b. Thus, the thermal capacity and the thermal conductivity of the porous metal plate 50 can be enhanced.

Furthermore, even when a large amount of heat is instantly generated by the semiconductor elements 71 to 74, the heat transferred from the semiconductor elements 71-74 to the insulating substrates 60 can be appropriately absorbed by the porous metal plates 50. This is because, in each plate 50 having the through holes 51 shaped as above, the heat capacity of the portion 53 on the insulating substrate 60 side tends to increase as compared with the case where there are provided the through holes 51K (indicated by the chain double-dashed line in FIG. 6) each having the section (the hole diameter) equal to that of the opening 51c in the back surface 50c and the columnar-shape extending to the front surface 50b.

In the semiconductor device 1 of Example 1, as above, the heat of the semiconductor elements 71 to 74 can be appropriately cooled.

Next, a method of manufacturing the semiconductor device 1 will be explained.

The fin member 20 made of aluminum is first prepared. For example, the fin member 20 is integrally made of aluminum by extrusion molding. Further, the first frame part 31 made of aluminum in a rectangular flat plate shape and the second frame part 32 made of aluminum are prepared. The second frame part 32 is produced by pressing a rectangular flat aluminum plate into an angular U shape.

In addition, four porous metal plates 50 each formed with a plurality of through holes 51 are prepared. Each porous metal plate 50 is produced by cutting a rectangular flat aluminum plate (by forming therein the through holes 51) for example by use of a drill with a truncated conical blade similar in shape to the through hole 51. Four insulating substrates 60 (e.g., ceramic plates made of alumina) are also prepared.

Successively, in an assembling process, the fin member 20 is put on a bottom surface 32b of the second frame part 32 (see FIG. 1). Then, the first frame part 31 is placed on an upper end face 32c of the second frame part 32 to cover the second frame part 32. At that time, upper end faces 22b of the fins 22 of the fin member 20 and an inner surface 31c of the first frame part 31 are put in contact with each other (see FIG. 2). The four porous metal plates 50 are arranged(spaced apart) in line(in a row) at regular intervals on the outer surface 31b of the first frame part 31 (see FIG. 1). The insulating substrates 60 are then placed respectively on the front surfaces 50b of the porous metal plates 50. The inner surface 31c of the first frame part 31, the bottom surface 32b of the second frame part 32, the back surface 50c of each porous metal plate 50, and the back surface 60 of each insulating substrate 60 (see FIG. 2) are applied in advance with a brazing material (e.g., Melting point: 600° C.).

In a bonding process, subsequently, the fin member 20, the first frame part 31, the second frame part 32, the porous metal plates 50, and the insulating substrates 60 assembled as mentioned above (into an assembly) are put in an electric furnace (not shown). Then, the internal temperature of the furnace is increased to 600° C. to melt the brazing material. Thereafter, the assembly is taken out of the electric furnace and cooled to harden the brazing material. In this way, the fin member 20, the first frame part 31, the second frame part 32, the porous metal plates 50, and the insulating substrates 60 are bonded together by brazing. At that time, the fin member 20, the first frame part 31, and the second frame part 32 brazed to each other constitute the cooler 10. The semiconductor elements 71 to 74 are then soldered respectively to the front surfaces 60b of the insulating substrates 60. The semiconductor device 1 of Example 1 (see FIG. 1) is thus completed.

Example 2

Example 2 of the invention will be explained below referring to the drawings.

A semiconductor device 100 (see FIGS. 1 and 7) of Example 2 is identical to the semiconductor device 1 (see FIGS. 1 and 2) of Example 1 except that thermal conductors are placed in through holes 51 of porous metal plates 50. The following explanation is therefore made with a focus on differences from Example 1 with the explanation of identical parts being omitted or simplified.

Figure 7:
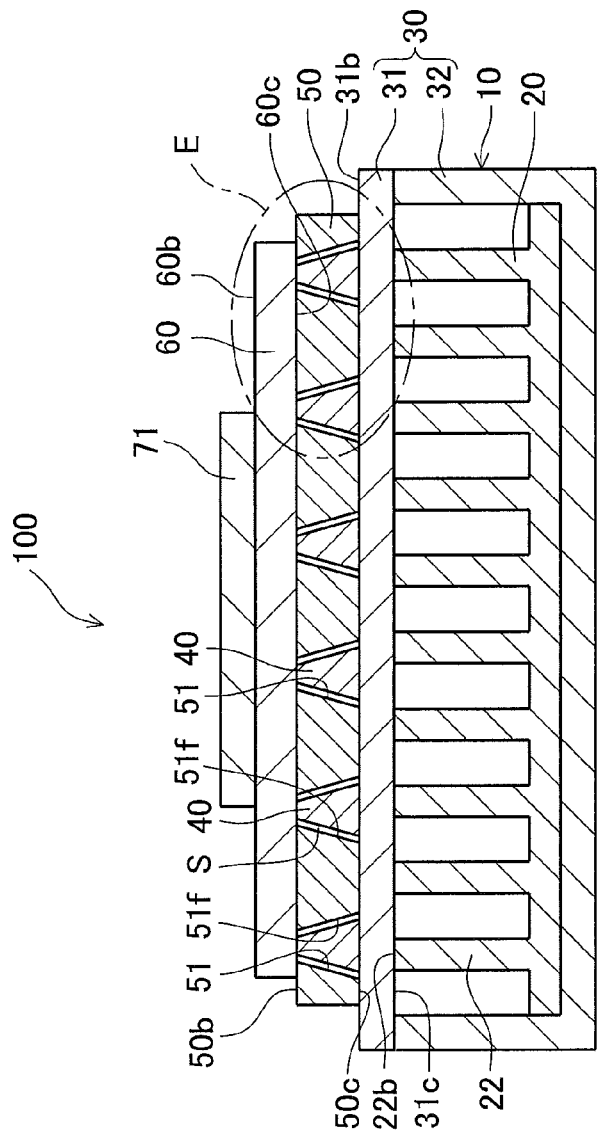
FIG. 7 is a sectional view of a semiconductor device of Example 2, taken along the line C-C in FIG. 1.

In the semiconductor device 100 of Example 2, as shown in FIG. 7, thermal conductors 40 are respectively set in through holes 51 of a porous metal plate 50. Each thermal conductor 40 is made of aluminum as with each porous metal plate 50 and has a shape (concretely, a truncated conical shape) extending from the front surface 50b (the face facing to the insulating substrate 60) to the back surface 50c (the face facing to the cooler 10) of the porous metal plate 50. The thermal conductors 40 are therefore placed respectively in the through holes 51 of the porous metal plate 50 while each thermal conductor 40 is in contact with the back surface 60c of each insulating substrate 60 and the outer surface 31b of the first frame part 31 forming the cooler 10. Accordingly, the heat having been transferred from the semiconductor elements 71 to 74 to the insulating substrates 60 can also be transferred to the cooler 10 through the thermal conductors 40 as well as the porous metal plates 50. This can improve the thermal conductivity from the semiconductor elements 71 to 74 to the cooler 10, thus enhancing the cooling capability of the semiconductor elements.

Figure 8:
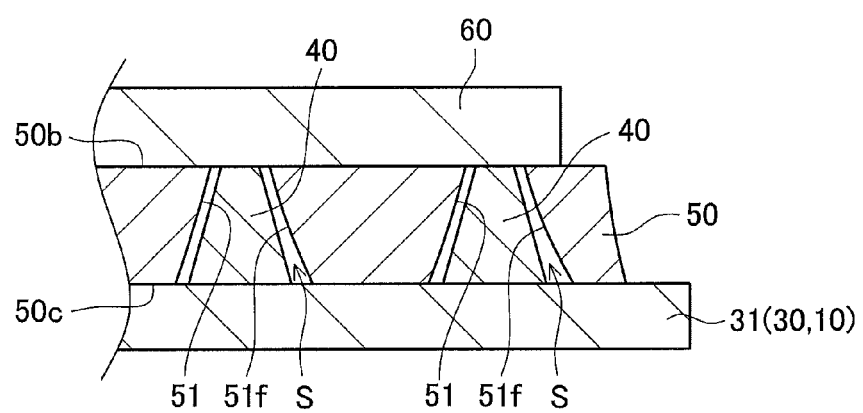
FIG. 8 is an explanatory view showing operations and effects of a porous metal plate of Example 2, corresponding to an enlarged view of part E in FIG. 7.

In Example 2, furthermore, each thermal conductor 40 is designed with a truncated conical shape slightly smaller (thinner) than each through hole 51. The thermal conductors 40 are therefore placed respectively in the through holes 51 of the porous metal plate 50 with a clearance S from the side surface 51f of each through hole 51 (see FIGS. 7 and 8). Accordingly, when the porous metal plate 50 warps or becomes deformed as shown in FIG. 8, deforming of the porous metal plate 50 is not interrupted by the thermal conductors 40. Also in the semiconductor device 100 of Example 2, as with the semiconductor device 1 of Example 1, the porous metal plates 50 can appropriately relax the stress caused due to the difference in linear expansion coefficient between the insulating substrates 60 and the cooler 10 (to be concrete, the first frame part 31). FIG. 8 shows a state where the porous metal plate 50 warps or becomes deformed, absorbing the thermal extension difference between the insulating substrate 60 and the cooler 10 (the first frame part 31).

Example 3

Example 3 of the invention will be explained below referring to the drawings.

A semiconductor device 200 (see FIGS. 1 and 9) of Example 3 is identical to the semiconductor device 1 (see FIGS. 1 and 2) of Example 1 except for the hole (pore) shape of the porous metal plates. The following explanation is therefore made with a focus on differences from Example 1 with the explanation of identical parts being omitted or simplified.

In Example 1, the holes of each porous metal plate 50 are provided as the through holes 51 open at the front surfaces 50b and the back surfaces 50c of each porous metal plate 50. In Example 3, in contrast, the holes of each porous metal plate 250 are provided as bottomed holes 251 (see FIG. 9) open at only a back surface 250c (the face facing to the cooler 10). Each bottomed hole 251 has a sectional shape (a sectional shape viewed when the porous metal plate 250 is cut along a direction perpendicular to the thickness direction), as with the through holes 51 of Example 1, gradually decreasing from the cooler 10 side toward the insulating substrate 60 side (from the back surface 250c toward the front surface 250b; from below to above in FIG. 9). To be more concrete, each bottomed hole 251 has a truncated conical shape with a diameter gradually decreasing (a hole diameter narrowing) from the back surface 250c toward the front surface 250b.

Each porous metal plate 250 is produced by cutting a rectangular flat aluminum plate (by forming therein the bottomed holes 251) for example by use of a drill with a truncated conical blade similar in shape to the bottomed hole 251.

As described above, the holes of each porous metal plate 250 are provided as the bottomed holes 251 open at only the back surface 250c (the face to the cooler 10). Thus, openings of the holes are absent at the front surface 250b (the face facing to the insulating substrate 60) of each porous metal plate 250. Accordingly, the porous metal plate 250 can provide higher thermal capacity and thermal conductivity in the portion (a portion 253 on the insulating substrate 60 side) close to the semiconductor elements 71 to 74 which are heat sources than the porous metal plates 50 of Example 1. The semiconductor device 200 of Example 3 can more enhance the cooling capability of the semiconductor elements than the semiconductor device 1 of Example 1.

Figure 10:
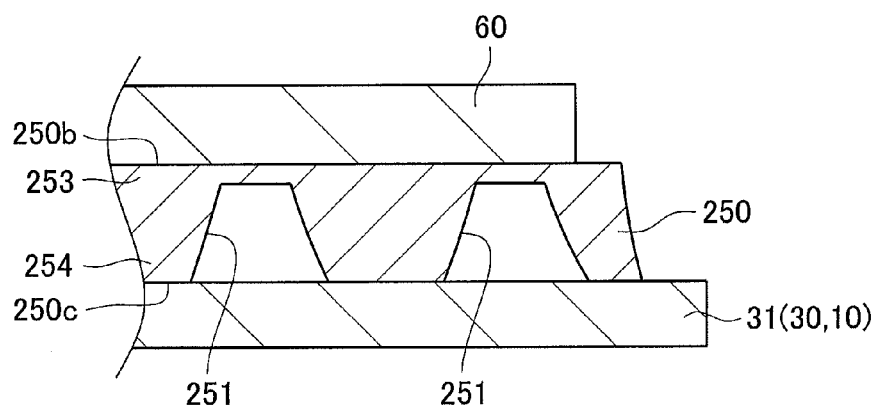
FIG. 10 is an explanatory view showing operations and effects of a porous metal plate of Example 3, corresponding to an enlarged view of part F in FIG. 9.

In each porous metal plate 250 of Example 3, as mentioned above, the bottomed holes 251 are formed as holes open at the face (the back surface 250c) facing to the cooler 10 (the member with large thermal extension) without opening at the face (the front surface 250b) facing to the insulating substrate 60 (the member with small thermal extension). As above, the opening of each bottomed hole 251 is formed in the face (the back surface 250c) facing to the cooler 10 (the member with large thermal extension). Accordingly, a portion 254 of each porous metal plate 250 on the cooler 10 side is low in rigidity, allowing the portion 254 of each plate 250 to easily warp or become deformed (see FIG. 10). Thus, the plates 250 can absorb the thermal extension difference between the insulating substrates 60 and the cooler 10 (the first frame part 31), thereby appropriately relaxing the stress caused due to the difference in linear expansion coefficient between the insulating substrates 60 and the cooler 10 (the first frame part 31) (see FIG. 10). FIG. 10 shows a state where the porous metal plate 250 warps or becomes deformed, thus absorbing the thermal extension difference between the insulating substrate 60 and the cooler 10 (the first frame part 31).

Example 4

Example 4 of the invention will be explained below referring to the drawings.

A semiconductor device 300 (see FIGS. 1 and 11) of Example 4 is identical to the semiconductor device 200 (see FIGS. 1 and 9) of Example 3 except that thermal conductors are placed in the bottomed holes 251 of each porous metal plate 250. The following explanation is therefore made with a focus on differences from Example 3 with the explanation of identical parts being omitted or simplified.

Figure 11:
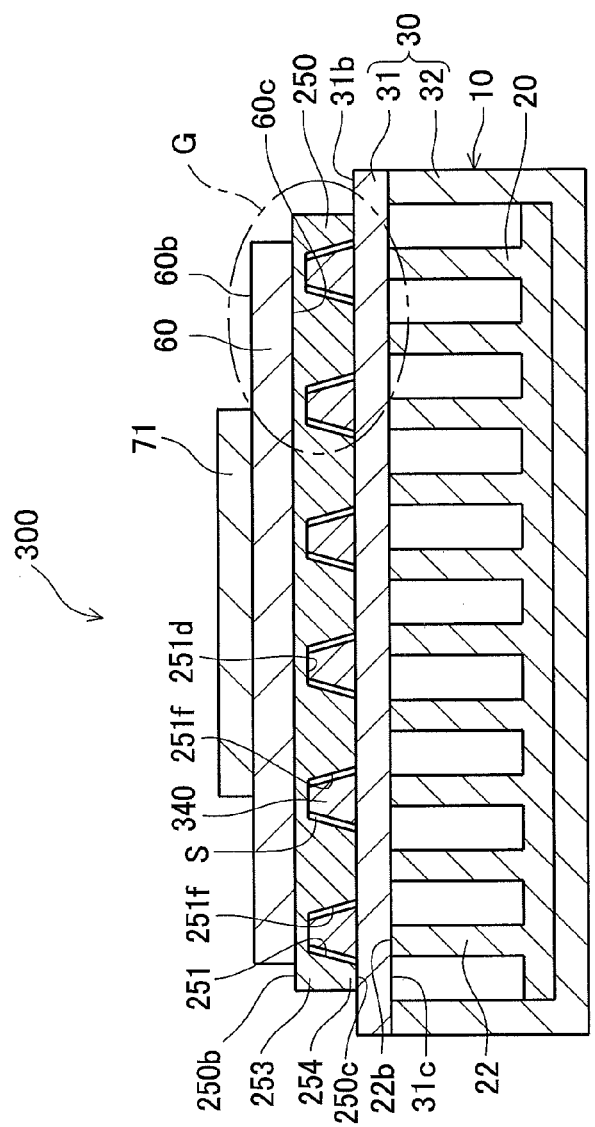
FIG. 11 is a sectional view of a semiconductor device of Example 4, taken along the line C-C in FIG. 1.

In the semiconductor device 300 of Example 4, as shown in FIG. 11, thermal conductors 340 are set in the bottomed holes 251 of each porous metal plate 250. Each thermal conductor 340 is made of aluminum, as with the porous metal plates 250, and formed in a shape (concretely, a truncated conical shape) extending from the bottom surface 251d toward the back surface 250c (the face facing to the cooler 10) of each bottomed hole 251. The thermal conductors 340 are respectively placed in the bottomed holes 251 of each porous metal plate 250 so that the thermal conductor 340 are in contact with the bottom surfaces 251d of the bottomed holes 251 of each porous metal plate 250 and the outer surface 31b of the first frame part 31 forming the cooler 10. Accordingly, the heat having been transferred from the semiconductor elements 71 to 74 to the insulating substrates 60 can be transferred to the cooler 10 also through the thermal conductors 340 as well as the porous metal plates 250. This can improve the thermal conductivity from the semiconductor elements 71 to 74 to the cooler 10, thereby enhancing the cooling capability of the semiconductor elements.

Figure 12:
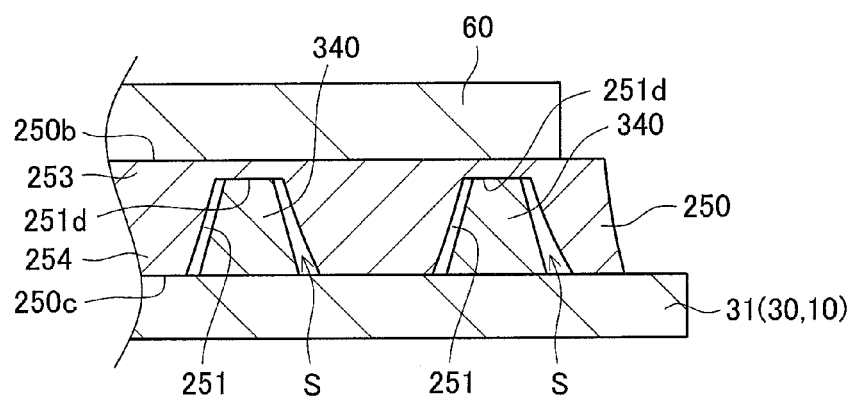
FIG. 12 is an explanatory view showing operations and effects of a porous metal plate of Example 4, corresponding to an enlarged view of part G in FIG. 11.

In addition, in Example 4, each thermal conductor 340 is designed with truncated conical shape slightly smaller (thinner) than each bottomed hole 251. The thermal conductors 340 are therefore placed respectively in the bottomed holes 251 of the porous metal plate 250 with a clearance S from the side surface 251f of each bottomed hole 251 (see FIGS. 11 and 12). Accordingly, when the porous metal plate 250 warps or becomes deformed as shown in FIG. 12, deforming of the porous metal plate 250 is not interrupted by the thermal conductors 340. Also in the semiconductor device 300 of Example 4, the porous metal plates 250 can appropriately relax the stress caused due to the difference in linear expansion coefficient between the insulating substrates 60 and the cooler 10 (to be concrete, the first frame part 31). FIG. 12 shows a state where the porous metal plate 250 warps or becomes deformed, absorbing the thermal extension difference between the insulating substrate 60 and the cooler 10 (the first frame part 31).

Example 5

Example 5 of the invention will be explained below referring to the drawings.

A semiconductor device 400 (see FIGS. 1 and 13) of Example 5 is identical to the semiconductor device 1 (see FIGS. 1 and 2) of Example 1 except for the hole (pore) shape of the porous metal plates.

In Example 1, the holes of each porous metal plate 50 are provided as the through holes 51 each having a truncated conical shape whose diameter gradually decreases (hole diameter narrows) from the back surface 50c toward the front surface 50b.

In Example 5, in contrast, as shown in FIGS. 14 to 17, the holes of each porous metal plate 450 are provided as through holes 451 and 452 having a sectional shape corresponding to a circular ring that is partly broken (i.e., a circular ring divided into halves) (a sectional shape corresponding to a circular ring that is not partly continuous when the porous metal plate 450 is taken along a direction perpendicular to its thickness direction). Each of the through holes 451 and 452 extends through the porous metal plate 450 from a front surface 450b (the face facing to the insulating substrate 60) to a back surface 450c (the face facing to the cooler 10) of the porous metal plate 450.

Outer peripheral surfaces 451f and 452f and inner peripheral surfaces 451g and 452g forming the through holes 451 and 452 are formed as tapered surfaces with the same taper angle and with diameters gradually decreasing from the back surface 450c toward the front surface 450b of the porous metal plate 450 (see FIGS. 14 to 17).

The through holes 451 and 452 configured as above each have a sectional shape (a sectional shape viewed when the porous metal plate 450 is cut along a direction perpendicular to its thickness direction) gradually narrowing from the cooler 10 side to the insulating substrate 60 side (from the back surface 450c toward the front surface 450b; from below to above in FIG. 13) (see FIGS. 14 to 17).

Each porous metal plate 450 of Example 5 includes a main body 455 formed in a rectangular flat plate-like shape, through holes 451 and 452, and thermal conductive portions 456 integrally continuous with the main body 451 (see FIGS. 13 to 17). Each thermal conductive portion 456 has a truncated conical shape having a side surface 456b surrounded by the through holes 451 and 452 and extending from the back surface 450c (the face facing to the cooler 10) to the front surface 450b (the face facing to the insulating substrate 60) of the porous metal plate 450. The main body 455 and each thermal conductive portion 456 are integrally connected to each other at positions where the through holes 451 and 452 are not continuous, i.e., integrally connected to each other through connecting portions 457 and 458 each extending from the back surface 450c to the front surface 450b of the porous metal plate 450 at the positions where the through holes 451 and 452 are not continuous (see FIGS. 15 and 17).

The porous metal plates 450 are produced for example by cutting a rectangular flat aluminum plate (by forming therein the through holes 451 and 452) with a machining center.

Figure 15:
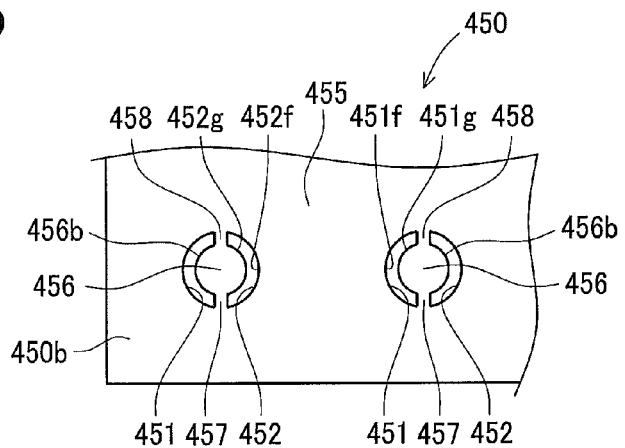
FIG. 15 is a view showing a part of a front surface of the porous metal plate of Example 5.
Figure 16:
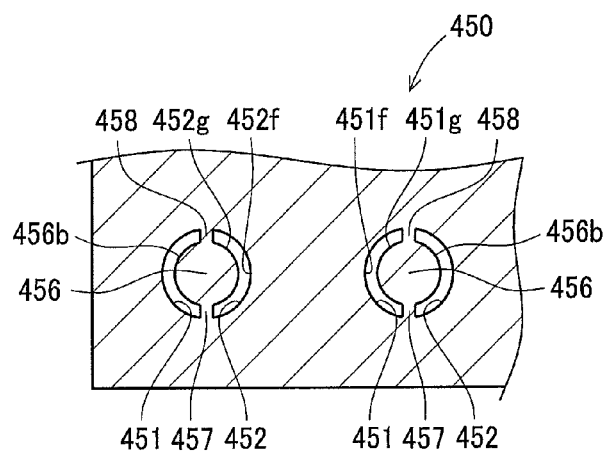
FIG. 16 is a view showing a part of a cross section of the porous metal plate of Example 5.
Figure 17:
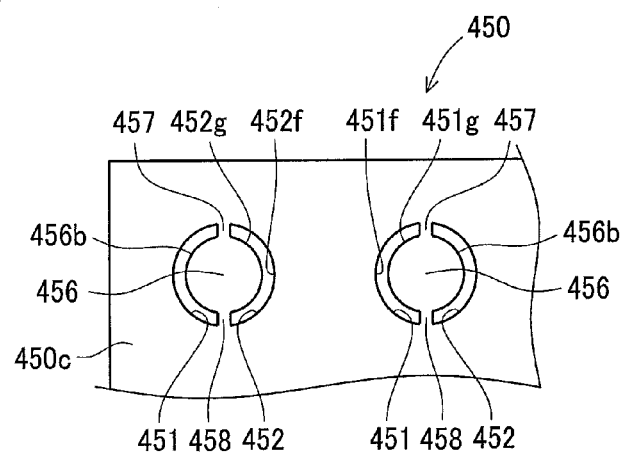
FIG. 17 is a view showing a part of a back surface of the porous metal plate of Example 5.

FIG. 15 is a view of a part of the porous metal plate 450 viewed from above the front surface 450b. FIG. 16 is a cross sectional view of the part of the porous metal plate 450 shown in FIG. 15, taken at a position between the front surface 450b and the back surface 450c (at a middle position in the thickness direction) and along the front surface 450b. FIG. 17 is a view of the part of the porous metal plate 450 shown in FIG. 15, viewed from below the back surface 450c.

Each aforementioned porous metal plate 450 can provide the same operations and effects as the "porous metal plate 50+thermal conductors 40" in the semiconductor device 100 of Example 2. Because the "main body 455" of the porous metal plate 450 of Example 5 corresponds to the "porous metal plate 50" of Example 2, the "thermal conductive portion 456" of the porous metal plate 450 of Example 5 corresponds to the "thermal conductor 40" of Example 2, and the "through holes 451 and 452" of the porous metal plate 450 of Example 5 correspond to the "clearance S (clearance between the side surface 51f of the through hole 51 of the porous metal plate 50 and the thermal conductor 40)" of Example 2.

Specifically, in the semiconductor device 400 of Example 5, the heat having been transferred from the semiconductor elements 71 to 74 to the insulating substrates 60 can be transferred to the cooler 10 also through the thermal conductive portions 456 (corresponding to the thermal conductors 40 of Example 2) as well as the main body 455 (corresponding to the porous metal plate 50 of Example 2). Accordingly, the thermal conductivity from the semiconductor elements 71 to 74 to the cooler 10 can be improved and thus the cooling capability of the semiconductor elements can be enhanced.

Figure 13:
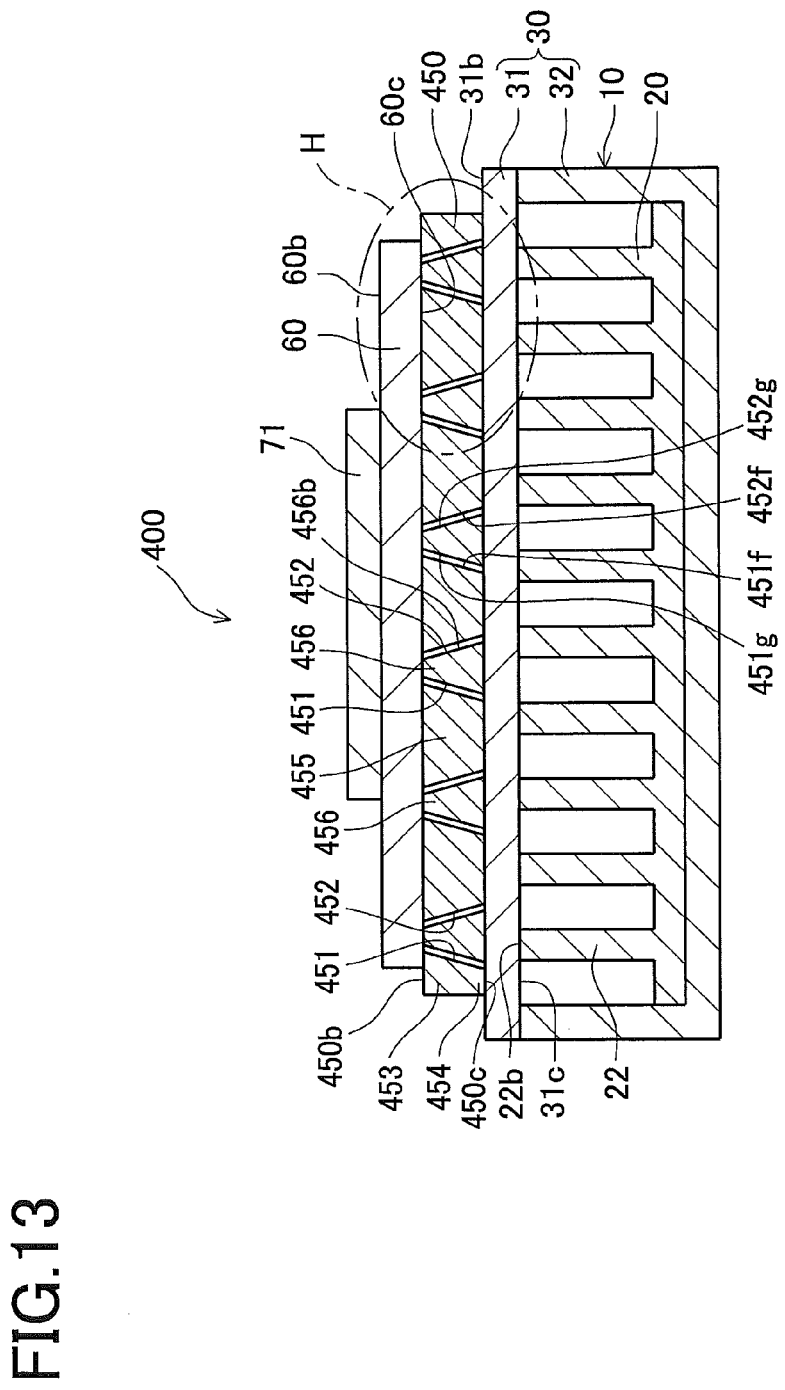
FIG. 13 is a sectional view of a semiconductor device of Example 5, taken along the line C-C in FIG. 1.
Figure 14:
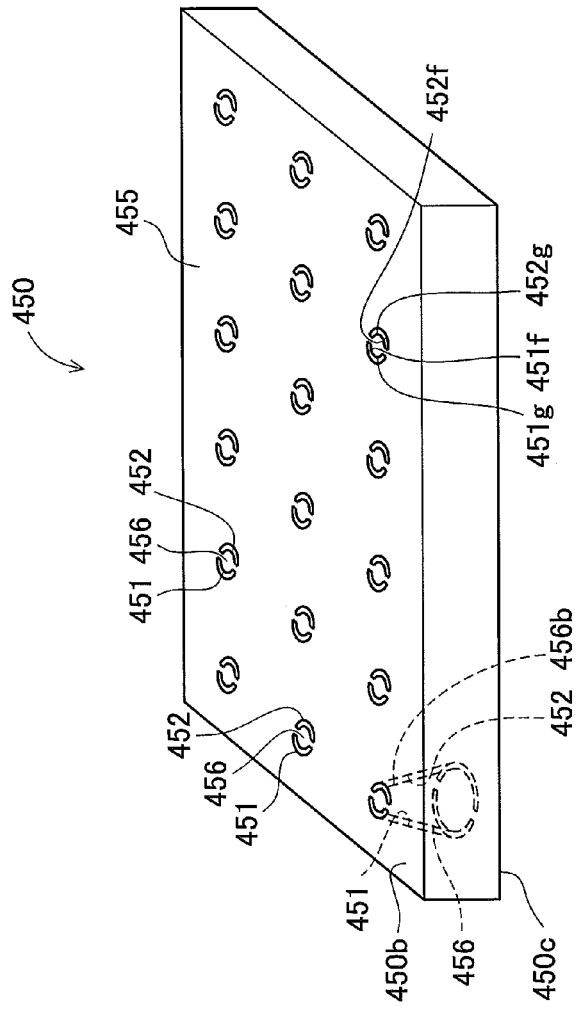
FIG. 14 is a perspective view of a porous metal plate of Example 5.
Figure 18:
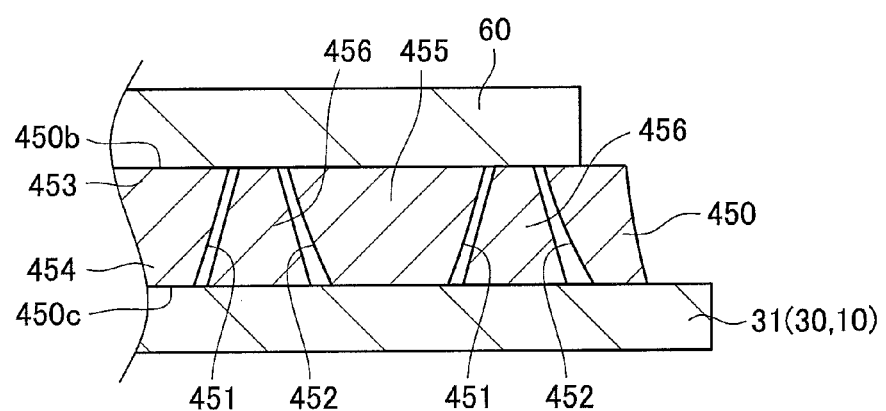
FIG. 18 is an explanatory view showing operations and effects of the porous metal plate of Example 5, corresponding to an enlarged view of part H in FIG. 13.

In addition, the through holes 451 and 452 (corresponding to the clearance S of Example 2) are interposed between the thermal conductive portion 456 (corresponding to the thermal conductor 40 of Example 2) and the main body 455 (corresponding to the porous metal plate 50 of Example 2) (see FIGS. 13 and 18). Accordingly, as shown in FIG. 18, when the porous metal plate 450 (the main body 455) warps or becomes deformed, deforming of the plate 450 (the main body 455) is not interrupted by the thermal conductive portions 456. Therefore, in the semiconductor device 400 of Example 5, as with the semiconductor device 100 of Example 2, the porous metal plates 450 can appropriately relax the stress caused due to the difference in linear expansion coefficient between the insulating substrates 60 and the cooler 10 (i.e., the first frame part 31). FIG. 18 shows a state where the main body 455 of the porous metal plate 450 warps or becomes deformed, thereby absorbing the thermal extension difference between the insulating substrate 60 and the cooler 10 (the first frame part 31).

Meanwhile, in the semiconductor device 100 of Example 2, the porous metal plates 50 and the thermal conductors 40 are separate components. In contrast, in the semiconductor device 400 of Example 5, the main body 455 of the porous metal plate 450 and the thermal conductive portions 456 are integrally connected at the positions where the through holes 451 and 452 are not continuous (at the connecting portions 457 and 458, see FIGS. 15 to 17). In other words, the thermal conductive portions 456 (corresponding to the thermal conductors 40 of Example 2) and the main body 455 (corresponding to the porous metal plate 50 of Example 2) are made in a single component. This can reduce the number of components and improve the productivity of the semiconductor device. Thus, the semiconductor device 400 of Example 5 is low in cost.

Example 6

Example 6 of the invention will be explained below referring to the drawings.

A semiconductor device 500 (see FIGS. 1 and 19) of Example 6 is identical to the semiconductor device 200 (see FIGS. 1 and 9) of Example 3 except for the hole (pore) shape of the porous metal plates.

Figure 9:
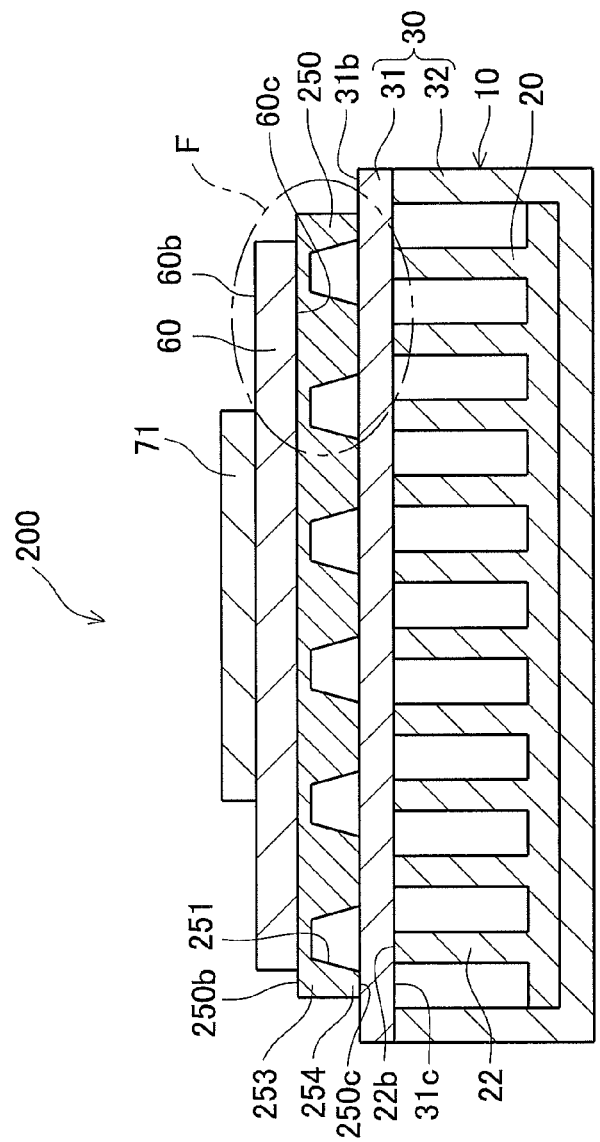
FIG. 9 is a sectional view of a semiconductor device of Example 3, taken along the line C-C in FIG. 1.

In Example 3, the holes of each porous metal plate 250 are provided as he bottomed holes 251 open at only the back surface 250c and having a truncated conical shape whose diameter gradually decreases (hole diameter narrows) from the back surface 250c toward the front surface 250b (see FIG. 9).

In contrast, in Example 6, as shown in FIGS. 19 to 22, the holes of each porous metal plate 550 are provided as bottomed holes 551 open at only a back surface 550c (the face facing to the 10). Each bottomed hole 551 has a circular-ring sectional shape (viewed when the porous metal plate 550 is cut along a direction perpendicular to its thickness direction is a circular ring shape). Each bottomed hole 551 extends from the back surface 550c toward a front surface 550b (the face facing to the insulating substrate 60) of the porous metal plate 550.

Figure 19:
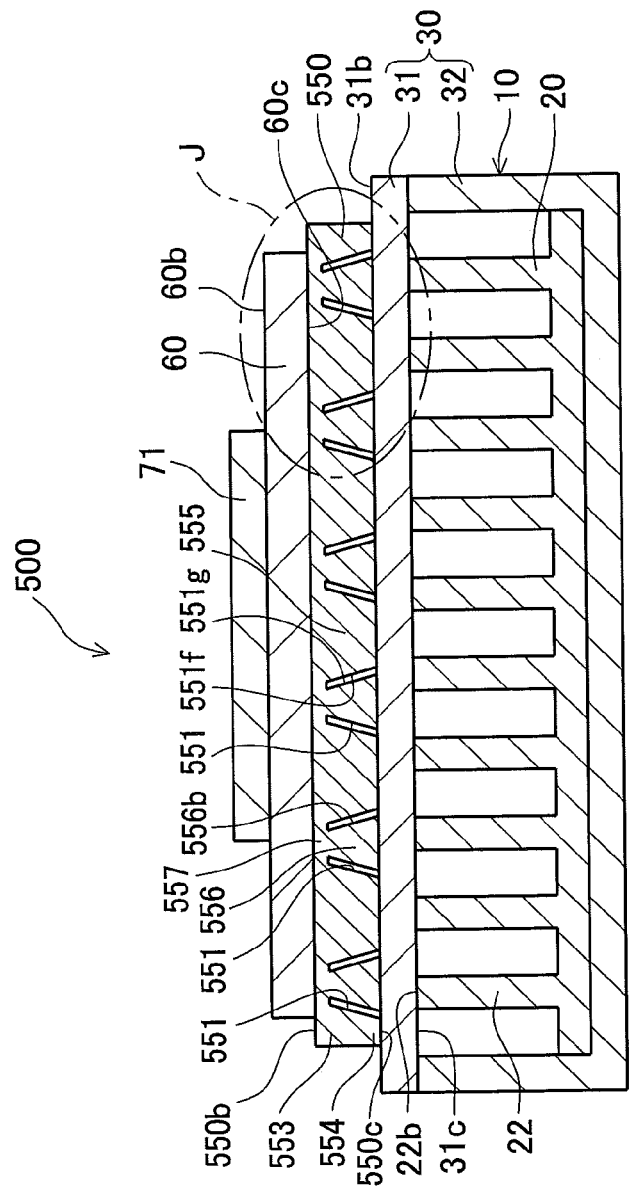
FIG. 19 is a sectional view of a semiconductor device of Example 6, taken along the line C-C in FIG. 1.
Figure 20:
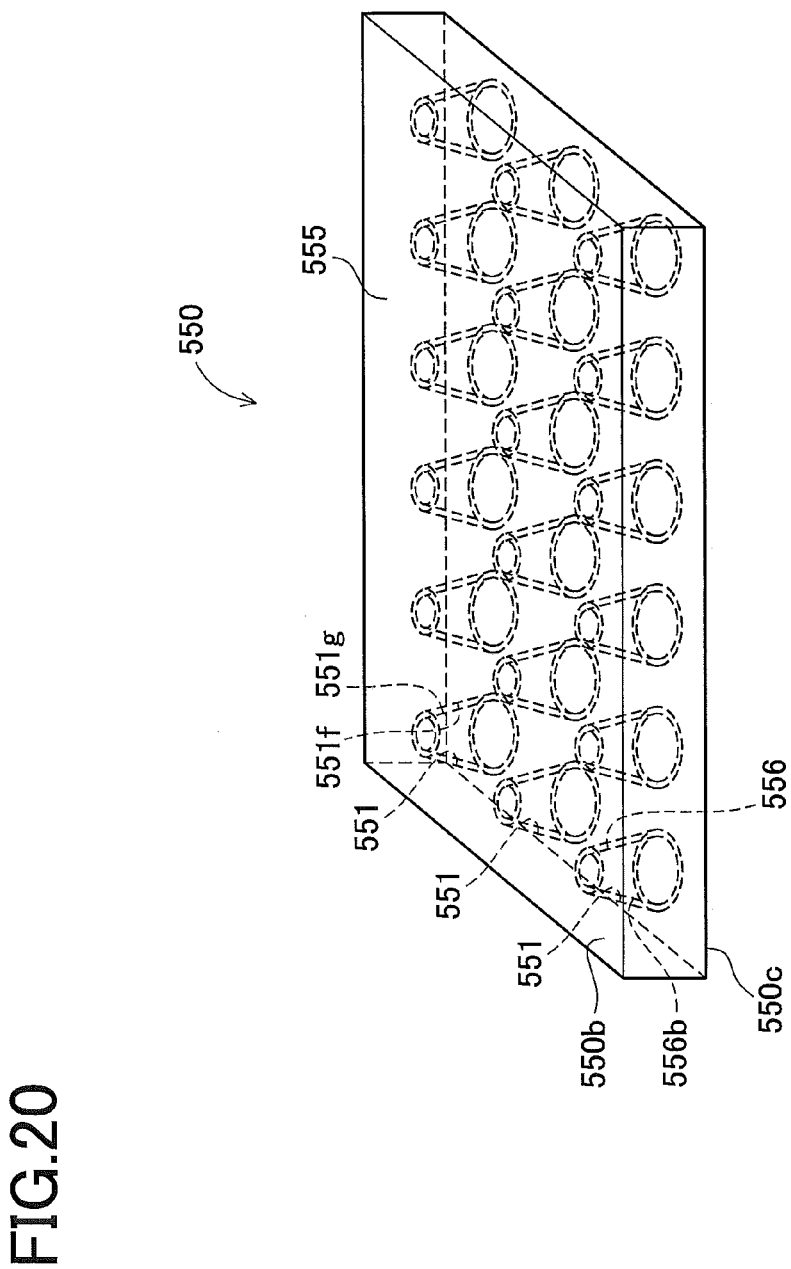
FIG. 20 is a perspective view of a porous metal plate of Example 6.

An outer peripheral surface 551f and an inner peripheral surface 551g of each bottomed hole 551 are formed as tapered surfaces with the same taper angle and with diameters gradually decreasing (narrowing) from the back surface 550c toward the front surface 550b of the porous metal plate 550 (see FIGS. 19 and 20).

In each bottomed hole 551 configured as above, its sectional shape (a sectional shape viewed when the porous metal plate 550 is cut along the direction perpendicular to the thickness direction) gradually narrows from the cooler 10 side toward the insulating substrate 60 side (from the back surface 550c toward the front surface 550b; from below to above in FIG. 19) (see FIGS. 20 and 22).

Each porous metal plate 550 of Example 6 includes a rectangular flat plate-like main body 555, the bottomed holes 551, and thermal conductive portions 556 integrally connected to the main body 555 (see FIGS. 19 to 22). Each thermal conductive portion 556 has a truncated conical shape having a side surface 556b surrounded by the bottomed hole 551 and extending from the back surface 550c (the face facing to the cooler 10) toward the front surface 550b (the face facing to the insulating substrate 60) of the porous metal plate 550. The main body 555 and each thermal conductive portion 556 are integrally connected on the insulating substrate 60 side of the thermal conductive portion 556 (integrally connected through a disk-like connecting portion 557 located on the insulating substrate 60 side of the thermal conductive portion 556) (see FIGS. 19 and 23).

Each porous metal plate 550 is produced for example by cutting a rectangular flat aluminium plate (by forming therein the bottomed holes 551) by use of a machining center.

Figure 21:
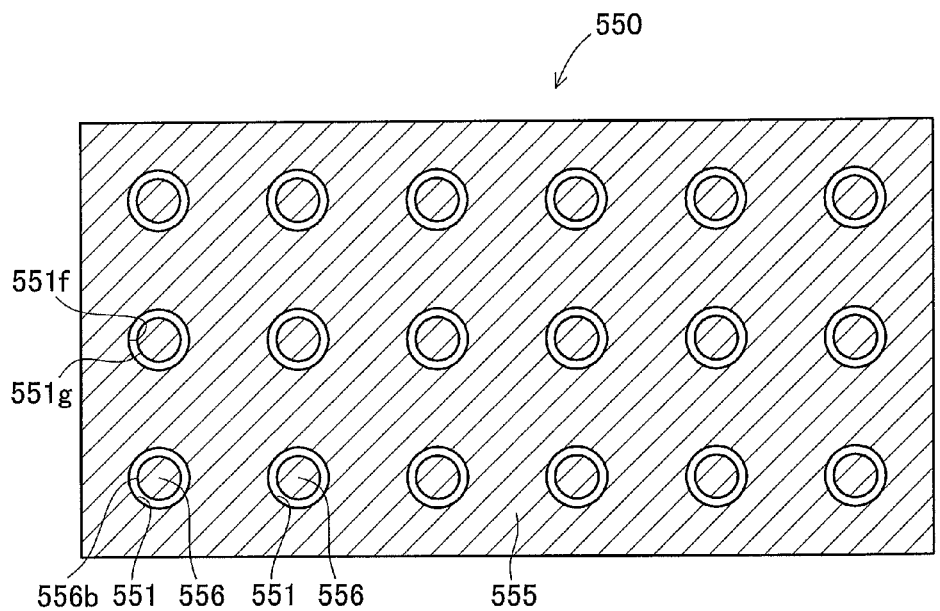
FIG. 21 is a cross sectional view of the porous metal plate of Example 6.

FIG. 21 is a cross sectional view of the porous metal plate 550 when cut at a position between the front surface 550b and the back surface 550c (at a middle position in the thickness direction) along the front surface 550b.

Figure 22:
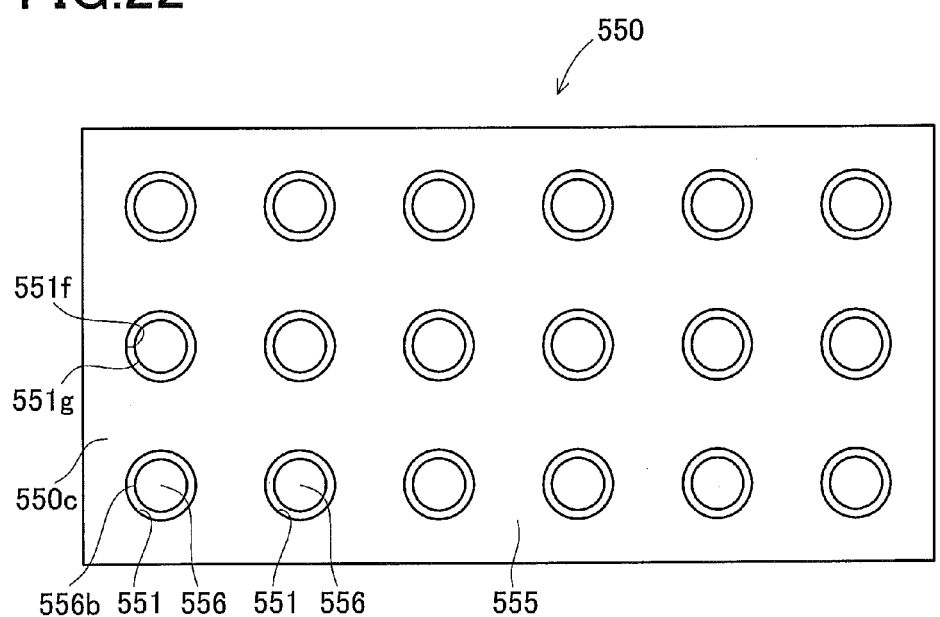
FIG. 22 is a view showing a back surface of the porous metal plate of Example 6.

FIG. 22 is a view of the porous metal plate 550 viewed from below the back surface 550c.

The aforementioned porous metal plate 550 can provide the same operations and effects as the "porous metal plate 250+thermal conductors 340" in the semiconductor device 300 of Example 4. Because the "main body 555" of the porous metal plate 550 corresponds to the "porous metal plate 250" of Example 4, the "thermal conductive portion 556" of the porous metal plate 550 of Example 6 corresponds to the "thermal conductor 340" of Example 4, and the "bottomed hole 551" of the porous metal plate 550 of Example 6 corresponds to the "clearance S (clearance between the side surface 251f of the bottomed hole 251 of the porous metal plate 250 and the thermal conductor 340)" of Example 6.

To be concrete, in the semiconductor device 500 of Example 6, the heat having been transferred from the semiconductor elements 71 to 74 to the insulating substrates 60 can be transferred to the cooler 10 also through the thermal conductive portions 556 (corresponding to the thermal conductors 340 of Example 4) as well as the main body 555 (corresponding to the porous metal plate 250 of Example 4). Thus, the thermal conductivity from the semiconductor elements 71 to 74 to the cooler 10 can be improved and thus the cooling capability of the semiconductor elements can be enhanced.

Figure 23:
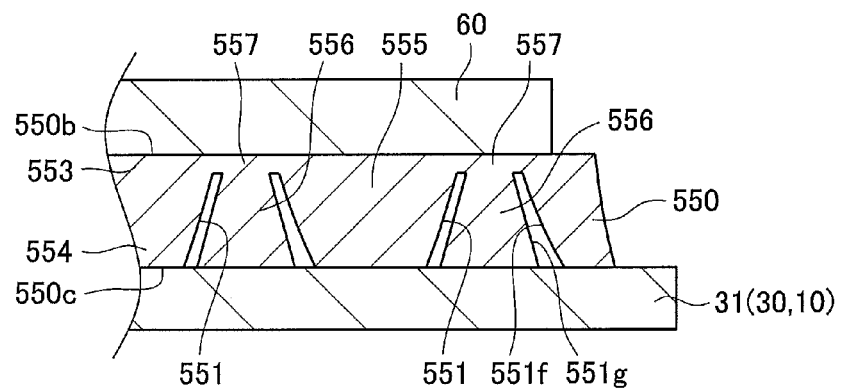
FIG. 23 is an explanatory view showing operations and effects of the porous metal plate of Example 6, corresponding to an enlarged view of part J in FIG. 19.

In addition, the bottomed holes 551 (corresponding to the clearance S of Example 4) are interposed between the thermal conductive portions 556 (corresponding to the thermal conductors 340 of Example 4) and the main body 555 (corresponding to the porous metal plate 250 of Example 4) (see FIGS. 19 and 23). Therefore, as shown in FIG. 23, when the porous metal plate 550 (the main body 555) warps or becomes deformed, deforming of the porous metal plate 550 (the main body 555) is not interrupted by the thermal conductive portions 556. Accordingly, in the semiconductor device 500 of Example 6, as with the semiconductor device 300 of Example 4, the porous metal plate 550 can also relax appropriately the stress caused by the difference in linear expansion coefficient between the insulating substrates 60 and the cooler 10 (i.e., the first frame part 31). FIG. 23 shows a state where the main body 555 of the porous metal plate 550 warps or becomes deformed, thereby absorbing the thermal extension difference between the insulating substrates 60 and the cooler 10 (the first frame part 31).

Meanwhile, in the semiconductor device 300 of Example 4, the porous metal plates 250 and the thermal conductors 340 are separate components. In contrast, in the semiconductor device 500 of Example 6, the main body 555 of each porous metal plate 550 and the thermal conductive portions 556 are integrally connected on the insulating substrate 60 side of the thermal conductive portion 556 (the connecting portions 557) (see FIGS. 19 and 23). Specifically, the thermal conductive portions 556 (corresponding to the thermal conductors 340 of Example 4) and the main body 555 (corresponding to the porous metal plate 250 of Example 4) are configured in a single component. This configuration can reduce the number of components and thus improve the productivity of the semiconductor device. The semiconductor device 500 of Example 6 is therefore low in cost.

The present invention is explained as above in Examples 1 to 6, but is not limited thereto. The present invention may be embodied in other specific forms without departing from the essential characteristics thereof.

In Examples 1 to 4, for instance, the holes (the through holes 51 and the bottomed holes 251) in the porous metal plates 50 and 250 have a truncated conical shape. The shape of holes in the porous metal plates may be any shape as long as it has a sectional shape gradually decreasing from a cooler side toward an insulating substrate side. For example, the shape may be conical, pyramidal, truncated pyramidal, or others.

In Example 6, each bottomed hole 551 of the porous metal plate 550 has a circular ring sectional shape. As an alternative, it also may have a sectional shape corresponding to a partly-broken circular ring (e.g., a circular ring divided into halves as in Example 5).

DESCRIPTION OF THE REFERENCE SIGNS

| | |
|---|---|
| 1, 100, 200, 300, 400, 500 | Semiconductor device |
| 10 | Cooler |
| 20 | Fin member |
| 40, 340 | Thermal conductor |
| 50, 250, 450, 550 | Porous metal plate |
| 50b, 250b, 450b, 550b | Front surface of Porous metal plate (Face facing to Insulating substrate) |
| 50c, 250c, 450c, 550c | Back surface of Porous metal plate (Face facing to Cooler) |
| 51, 451, 452 | Through hole (Hole of Porous metal plate) |
| 60 | Insulating substrate |
| 71, 72, 73, 74 | Semiconductor device |
| 251, 551 | Bottomed hole (Hole of Porous metal plate) |
| 251d | Bottom surface of Bottomed hole |
| 455, 555 | Main body of Porous metal plate |
| 456, 556 | Thermal conductive portion of Porous metal plate |
| 456b, 556b | Side surface of Thermal conductive portion |

The invention claimed is:

1. A semiconductor device comprising an insulating substrate, a semiconductor element placed on the insulating substrate, a cooler, and a porous metal plate formed with a plurality of holes and placed between the insulating substrate and the cooler, each of the holes of the porous metal plate has a cross-sectional shape gradually decreasing from the cooler side toward the insulating substrate side, and
the porous metal plate further includes:
a main body; and
a thermal conductive portion having a side surface surrounded by the hole and extending from the face of the porous metal plate facing to the cooler toward the insulating substrate, the thermal conductive portion being integrally connected to the main body,
wherein the holes of the porous metal plate are through hole each having a sectional shape corresponding to a partly-broken ring, the through holes extending through the porous metal plate from the face of the porous metal plate facing to the insulating substrate toward the face facing the cooler, the through holes being placed respectively around the side surfaces of the thermal conductive portions, and
the main body of the porous metal plate and the thermal conductive portions are integrally connected at a position where the ring shape of the through hole is broken.

2. A semiconductor device comprising an insulating substrate, a semiconductor element placed on the insulating substrate, a cooler, and a porous metal plate formed with a plurality of holes and placed between the insulating substrate and the cooler, each of the holes of the porous metal plate has a cross-sectional shape gradually decreasing from the cooler side toward the insulating substrate side, and
the porous metal plate further includes:
a main body; and
a thermal conductive portion having a side surface surrounded by the hole and extending from the face of the porous metal plate facing to the cooler toward the insulating substrate, the thermal conductive portion being integrally connected to the main body,
wherein the holes of the porous metal plate are bottomed holes each having a sectional shape corresponding to one of a ring shape and a partly-broken ring shape, the bottomed holes extending from the face of the porous metal plate facing to the cooler toward the insulating substrate, the bottomed holes being open at only the face of the porous metal plate facing to the cooler, and the bottomed holes being placed respectively around the side surfaces of the thermal conductive portions, and
the main body of the porous metal plate and the thermal conductive portions are integrally connected at least on the insulating substrate side of the thermal conductive portions.

* * * * *